US010593927B2

(12) United States Patent
Mäki

(10) Patent No.: US 10,593,927 B2
(45) Date of Patent: Mar. 17, 2020

(54) BATTERY OUTPUT DISABLE WHEN UNCONNECTED

(71) Applicant: Microsoft Technology Licensing, LLC, Redmond, WA (US)

(72) Inventor: Jani Mäki, Turku (FI)

(73) Assignee: Microsoft Technology Licensing, LLC, Redmond, WA (US)

( * ) Notice: Subject to any disclaimer, the term of this patent is extended or adjusted under 35 U.S.C. 154(b) by 222 days.

(21) Appl. No.: 15/582,434

(22) Filed: Apr. 28, 2017

(65) Prior Publication Data

US 2018/0315983 A1  Nov. 1, 2018

(51) Int. Cl.
*H01M 2/34* (2006.01)
*H01M 2/30* (2006.01)
*H02H 7/18* (2006.01)
*G01R 31/02* (2006.01)
*H01M 2/02* (2006.01)
*H01M 10/42* (2006.01)
*G01R 31/364* (2019.01)

(52) U.S. Cl.
CPC ............ *H01M 2/34* (2013.01); *G01R 31/025* (2013.01); *H01M 2/30* (2013.01); *H02H 7/18* (2013.01); *G01R 31/364* (2019.01); *H01M 2/02* (2013.01); *H01M 10/425* (2013.01); *H01M 10/4235* (2013.01); *H01M 2200/00* (2013.01)

(58) Field of Classification Search
None
See application file for complete search history.

(56) References Cited

U.S. PATENT DOCUMENTS

| 5,831,351 A | 11/1998 | Khosrowpour et al. |
| 7,429,848 B2 | 9/2008 | Briggs et al. |
| 7,605,565 B2 | 10/2009 | Wozniak |
| 2004/0212350 A1 | 10/2004 | Patino et al. |
| 2007/0210758 A1 | 9/2007 | Gangstoe et al. |
| 2012/0062206 A1 | 3/2012 | Depew |
| 2013/0154547 A1 | 6/2013 | Wada et al. |
| 2013/0200853 A1 | 8/2013 | Ro |
| 2015/0137618 A1 | 5/2015 | Vaajala et al. |

FOREIGN PATENT DOCUMENTS

| CN | 103078358 A | 5/2013 |
| WO | 2016023711 A1 | 2/2016 |

OTHER PUBLICATIONS

"Pull-up Resistors", https://web.archive.org/web/20150301000000*/https://learn.sparkfun.com/tutorials/pull-up-resistors, Published on: Mar. 30, 2015, 4 pages.
"L6924D Battery charger system with integrated power switch for Li-Ion/Li-Polymer", http://www.st.com/content/ccc/resource/technical/document/datasheet/group2/50/c4/60/ab/e6/09/4f/80/CD00079821/files/CD00079821.pdf/jcr:content/translations/en.CD00079821.pdf, Published on: Sep. 2010, pp. 1-38.

*Primary Examiner* — Sarah A. Slifka

(57) ABSTRACT

A battery output disable when unconnected is described. In an implementation, a battery comprises: a conductive terminal configured to electrically connect to a battery-powered device; wherein the conductive terminal is disconnected from battery connector terminals; and a controller configured to detect whether the conductive terminal is grounded, and to enable the battery connector terminals if the conductive terminal is grounded and disable the battery connector terminals if the conductive terminal is not grounded. In other implementations, a battery protection circuit and a method are discussed.

20 Claims, 4 Drawing Sheets

BATTERY OUTPUT DISABLE WHEN UNCONNECTED

BACKGROUND

Battery energy density, which is increasing rapidly may potentially be a safety risk. For example, a lithium battery can have high energy density. Typically, battery connector terminals are always active. The terminals are also exposed. Battery output voltage is typically present on the battery connector terminals, which may cause a safety hazard in battery transport, during assembling or disassembling the battery to or from the battery-operated device. Accidental short-circuiting of the terminals, for example during transport, at assembly or disassembly, may cause battery damage, electric sparks, undesired heating, smoke and even a fire in the worst case scenario.

SUMMARY

This summary is provided to introduce a selection of concepts in a simplified form that are further described below in the detailed description. This summary is not intended to identify key features or essential features of the claimed subject matter, nor is it intended to be used to limit the scope of the claimed subject matter.

A battery output disable when unconnected is described. In an embodiment, a battery comprises: a conductive terminal configured to electrically connect to a battery-powered device; wherein the conductive terminal is disconnected from battery connector terminals; and a controller configured to detect whether the conductive terminal is grounded, and to enable the battery connector terminals if the conductive terminal is grounded and disable the battery connector terminals if the conductive terminal is not grounded.

In other embodiments, a battery protection circuit and a method are discussed.

Many of the attendant features will be more readily appreciated as they become better understood by reference to the following detailed description considered in connection with the accompanying drawings.

DESCRIPTION OF THE DRAWINGS

The present description will be better understood from the following detailed description read in light of the accompanying drawings, wherein.

Like references are used to designate like parts in the accompanying drawings.

DETAILED DESCRIPTION

The detailed description provided below in connection with the appended drawings is intended as a description of the implementations and is not intended to represent the only forms in which the embodiment may be constructed or utilized. However, the same or equivalent functions and structures may be accomplished by different implementations.

Although the example implementations may be described and illustrated herein as being implemented in a mobile device, for example, a smartphone, this is only an example implementation of a battery-powered device and not a limitation. As those skilled in the art will appreciate, the present implementations are suitable for application in a variety of different types of appliances and devices powered by batteries, for example, mobile phones, portable media players, tablets, portable computers, tools with rechargeable batteries, electric vehicles, high power batteries, real estate high power batteries, rechargeable power backups.

Battery output voltage is typically present on battery connector terminals, which may cause a safety hazard, for example, in battery transport, during assembling or disassembling the battery to or from the device. The battery output voltage is only present when the battery is connected to a device. A controller of the battery, such as, a battery safety circuit, may detect whether the battery is connected to the battery-powered device. The connection can be detected by grounding a conductive terminal of the battery, which is not connected to the actual battery connector terminals and a cell, to a ground of the battery powered device. The controller may further disable the battery output by default when the battery is not connected. An enable or disable operation may be implemented without adding any extra pins to the battery terminals, for example, by only using the conductive soldering area, or a chassis of the battery connector, as a kind of an extra pin.

The conductive terminal is not connected to the battery connector terminals. The conductive terminal may be permanently disconnected from the battery connector terminals. The battery voltage, which is connected to the battery connection terminals, does not leak to the conductive terminal. The battery voltage does not also disturb the detection whether the conductive terminal is grounded.

Modern batteries may have a huge amount of energy stored in them, and they can be potentially dangerous, for example, when short-circuited unintentionally. A safety mechanism based on the galvanic battery connection improves the safety aspect of batteries, for example, in air, sea and ground transport and also in device production lines and device repair centers.

Figure 1:
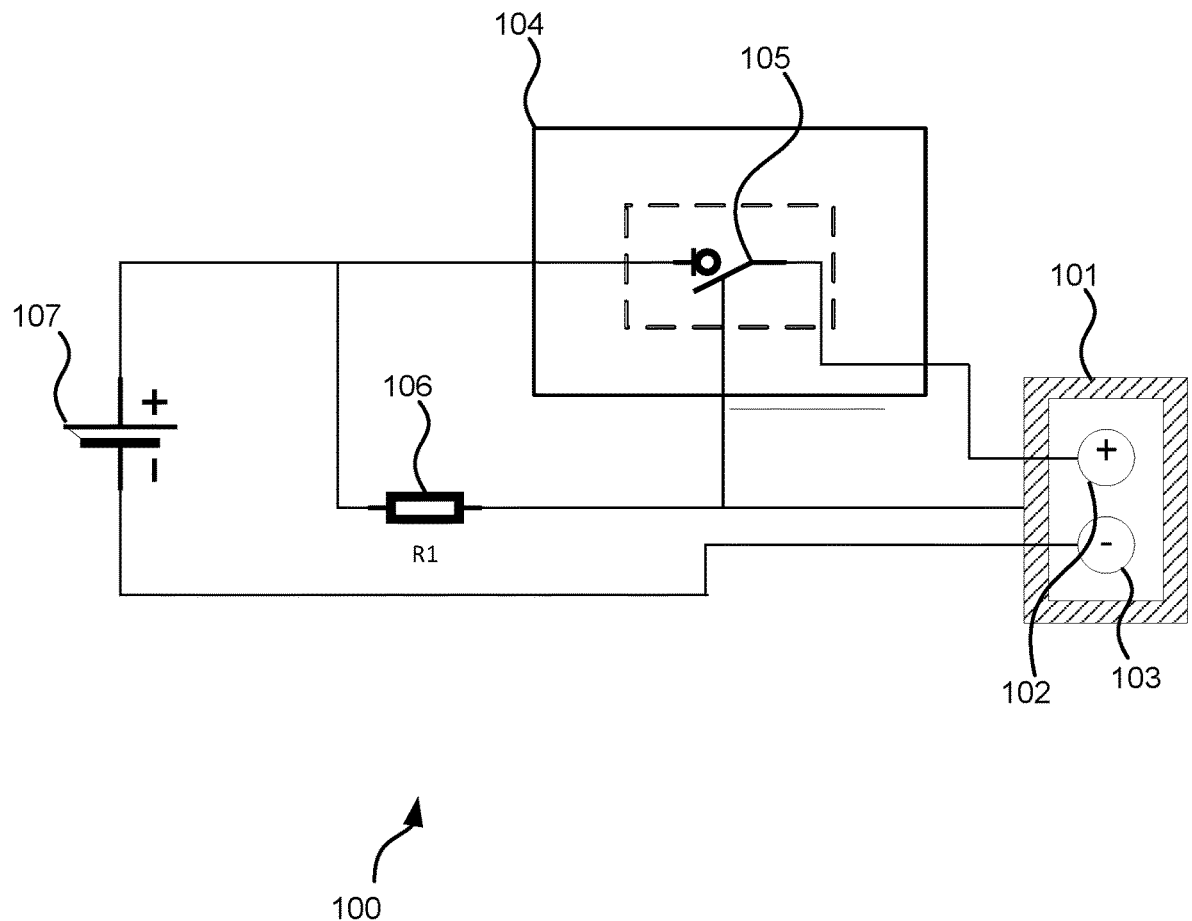
FIG. 1 illustrates a schematic representation of a circuit diagram of a battery with battery terminal protection when the battery is not connected to a battery-powered device.

FIG. 1 illustrates a schematic representation of a circuit diagram of a battery 100 with battery terminal protection when the battery 100 is not connected to a battery-powered device (not shown in FIG. 1).

The battery 100 comprises a battery cell 107. There may be one or a plurality of battery cells in the battery 100. The battery 100 comprises a conductive terminal 101. The conductive terminal 101 is electrically floating, for example so that it is not connected to a ground of the battery 100. Furthermore, the conductive terminal 101 is not connected to actual battery connector terminals 102, 103. The conductive terminal 101 may be connected to a battery chassis or housing. The conductive terminal 101 may also be a part of the chassis or housing, for example, by the design of the battery 100. According to an alternative implementation, the conductive terminal 101 may be an additional pin of the battery 100. A positive battery terminal 102 is connected to the cell positive 107. A negative battery terminal 103 is connected to the cell negative 107.

The battery 100 also comprises a controller 104. The controller 104 may be a battery safety integrated circuit. The controller 104 comprises a switch 105. The switch 105 is controlled by the controller 104. The switch 105 may connect or disconnect the positive battery terminal 101 and the cell positive 107. Consequently, the switch connects the voltage and power to the battery terminals 102, 103. The controller 104 may be implemented by hardware, for example by a programmable logic. According to another implementation, the controller may be implemented by a processor, which is controlled by software.

A resistor 106 is arranged between the conductive terminal 101 and the positive terminal of the cell 107. The resistor 106 is used to pull the conductive terminal 101 potential to a high voltage level, for example to a cell 107 voltage, when the conductive terminal 101 is electrically floating. Without the resistor 106, the voltage level of the conductive terminal 101 is unknown while it is electrically floating, and this may lead to false operation of the controller 104. The resistance value of the resistor 106 is set sufficiently high to avoid excess leakage current when the conductive terminal 101 is connected to ground. The controller 104 detects the voltage level of the conductive terminal 101. If the voltage level at the conductive terminal 101 is pulled up to the cell 107 voltage, the battery 100 is not connected and the battery connector terminals 102, 103 can be disabled. If the voltage level at the conductive terminal 101 is pulled low to ground, the battery 100 is connected and the output can be enabled.

Figure 2:
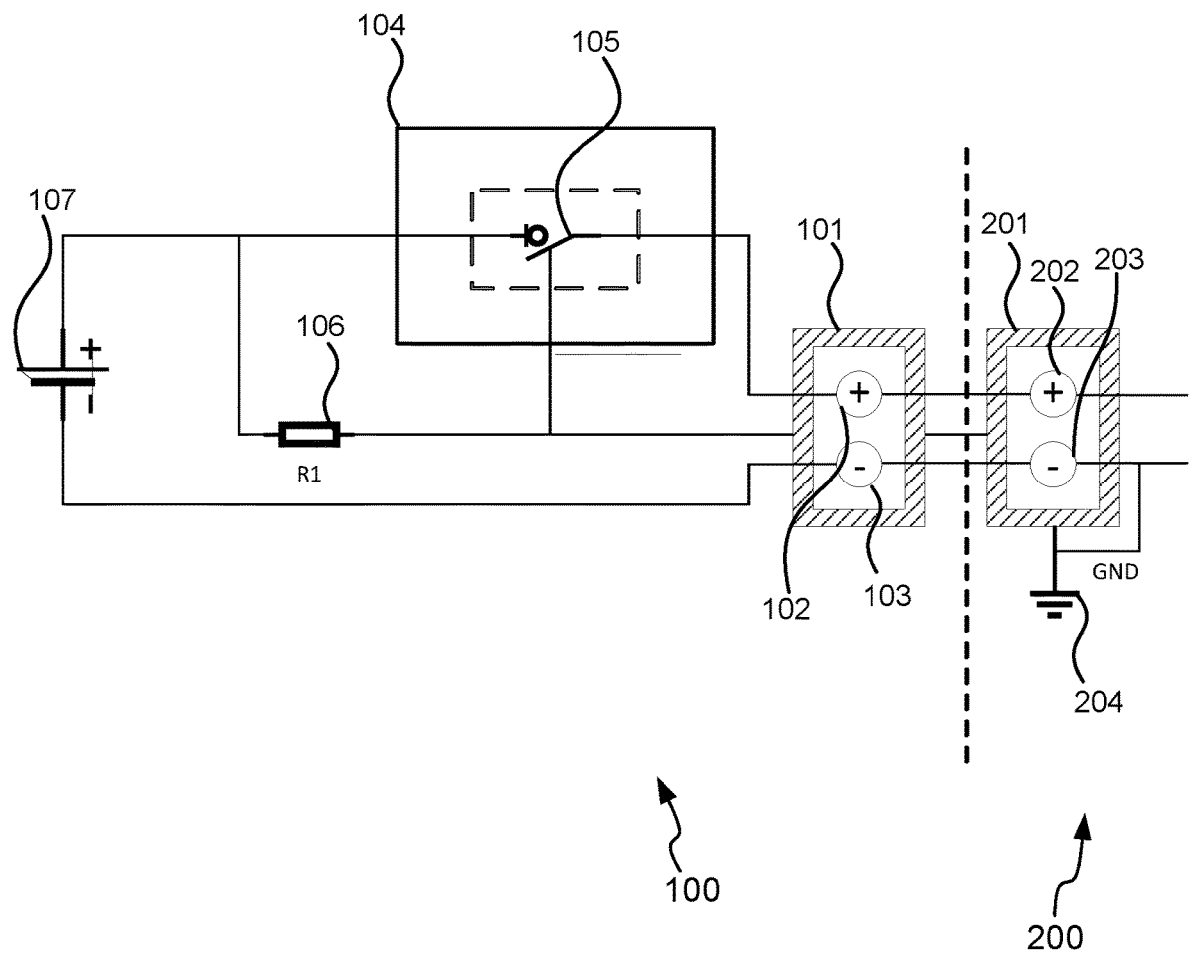
FIG. 2 illustrates a schematic representation of a circuit diagram of a battery with battery terminal protection when the battery is connected to a battery-powered device.

FIG. 2 illustrates a schematic representation of a circuit diagram of a battery 100 with battery terminal protection when the battery 100 is connected to a battery-powered device 200.

The battery-powered device 200 comprises a conductive terminal 201. The conductive terminal 201 is connected to a ground 204 so that the conductive terminal 201 is grounded. The ground 204 may be connected to a main board of the device 200. According to an implementation the ground may be a main board ground. The conductive terminal 201 may be connected to, or be a part of, a battery connector or housing. According to another implementation, the conductive terminal 201 may be an additional pin of the device 200.

When battery 100 is connected to device 200, a positive battery device terminal 202 is connected to the positive battery terminal 102. A negative battery device terminal 203 is connected to the negative battery terminal 103. The conductive terminal 101 of the battery 100 is also connected to the conductive terminal 201 of the device 200. Consequently, the conductive terminal 101 of the battery 100 is grounded via the conductive terminal 201 to the ground 204.

According to an implementation, the conductive terminal 101 may be a dedicated flex connector design to allow for a compact design. The conductive terminal 101 in the battery 100 may be soldered to the flex. The conductive terminal 201 in the device 200 may be soldered to the main board. The solder area on the main board may be connected to the ground 204.

Referring to FIG. 1 and FIG. 2, the controller 104 can have two different states. They may be logical states. The first state may be an indication that the battery 100 is not connected to the device 200. In the first state, the conductive terminal 101 may be electrically floating, i.e., not connected to the ground. The second state may an indication that the battery 100 is connected to the device 200. In the second state, the conductive terminal 101 is grounded, i.e., connected to the ground 204. The controller 104 monitors the conductive terminal 101. A signal can be created, and the controller 104 may have the signal pulled up with a resistor 106, creating the logic state high, when the battery 100 is not connected to a device 200. The signal may be a battery safety circuit enable or disable signal. When the battery 100 is connected to a device 200, the conductive terminal 101 is grounded via the device ground 204 and the signal is pulled to the logic state low. In the low state, the battery voltage is present at the battery connector terminals 102,103 and in the high state the battery connector terminals 102,103 are disabled and the battery voltage is not present.

Figure 3:
FIG. 3 illustrates a schematic representation of a timing diagram of a battery.
Figure 4:
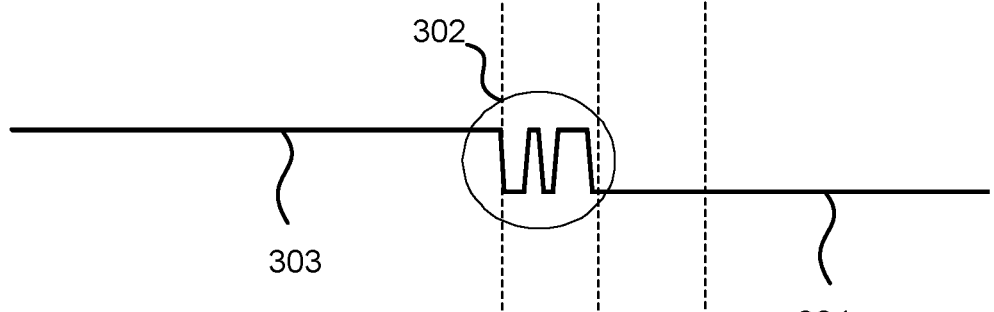
FIG. 4 illustrates a schematic representation of a timing diagram of a battery.
Figure 5:
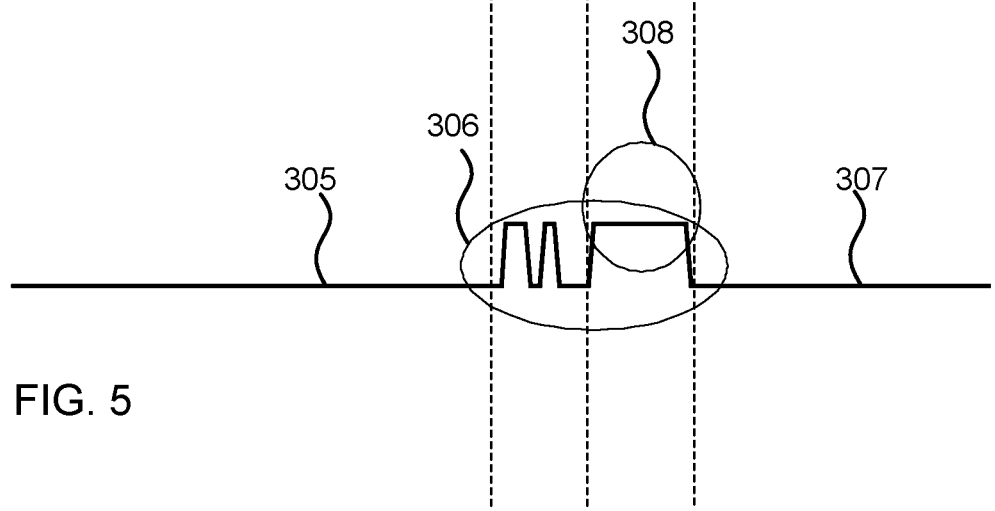
FIG. 5 illustrates a schematic representation of a timing diagram of a battery with battery terminal protection comprising a timer.

FIG. 3, FIG. 4 and FIG. 5 illustrate schematic representations of timing diagrams. Dashed vertical lines illustrate the points of time where functions are operations of the battery 100 change, and the timing diagrams are aligned with respect to each other.

FIG. 3 illustrates a schematic representation of a timing diagram of a battery output. The battery output may be a voltage level as measured between the battery connector terminals 102 and 103. The battery output has two different states. For example, as described above with respect to FIG. 1 and FIG. 2: the low state 300 and the high state 301. FIG. 3 illustrates the actual battery voltage level, whereby the low state 300 indicates that the battery 100 is not connected and thus there is no voltage at the battery connector terminals 102,103. The high state 301 indicates that the battery 100 is connected and voltage is present at the battery connector terminals 102,103.

FIG. 4 illustrates a schematic representation of a timing diagram of the signal at the conductive terminal 101. The controller 104, for example, the safety circuit IC, needs to have the dedicated signal for enabling the battery output of the battery connector terminals 102, 103. The signal may also be referred to as an output enable signal. A high state 303 indicates that the battery 100 is not connected. The signal is pulled to the cell 107 voltage via a resistor 106. A low state 304 indicates that the battery 100 is connected and the signal is pulled to the ground due to grounding via the battery connector chassis or by other means. A circle 302 illustrates a point in time when the battery 100 is connected to the device 200. During the battery connection, the signal may change its state several times between the high state 303 and the low state 304 as illustrated within the circle 302.

FIG. 5 illustrates a schematic representation of a timing diagram of a battery 100 with battery terminal protection comprising a delay by a timer. In FIG. 5, the delay timer may be stopped as illustrated by reference 305. The delay timer is activated and reset, as illustrated by reference 306, based on the signal as illustrated in the reference 302 of FIG. 4. Once the delay timer reaches the set target time, the battery output (the battery connector terminals 102, 103) can be activated (as illustrated by the high state 301 of FIG. 3). The timer is then reset and disabled as illustrated by a reference 307 of FIG. 5. The controller 104, for example, the safety circuit IC, needs to have a dedicated signal for enabling the battery output. Once the signal goes to the high state 303 of FIG. 4 (the output disable 300 of FIG. 3), the battery output voltage should be turned off immediately without any delay. Once the signal goes to the low state 304 of FIG. 4 (the output enable 301 of FIG. 3), there may be a short delay (1000 ms for example) before activating the battery connector terminals 102,103. The delay may be caused by a timer. This timer is reset every time the signal goes to the high state 303, as illustrated by reference 306. This is to avoid activation of output voltage too early when, for example, having some difficulties in connecting the battery 100 to the device 200.

The timer is activated when the output enable signal goes to the low state 304. If the output enable signal goes to the high state 303 during the timer delay, the timer is deactivated and reset. If the output enable signal stays low 304 long enough, the timer expires, as illustrated by reference 308, and allows the battery output to be enabled. According to an implementation, the timer may be set for 1000 milliseconds. The timer delay may improve the safety of the battery 100. For example, the delay may prevent unintentional enabling of the battery output.

Figure 6:
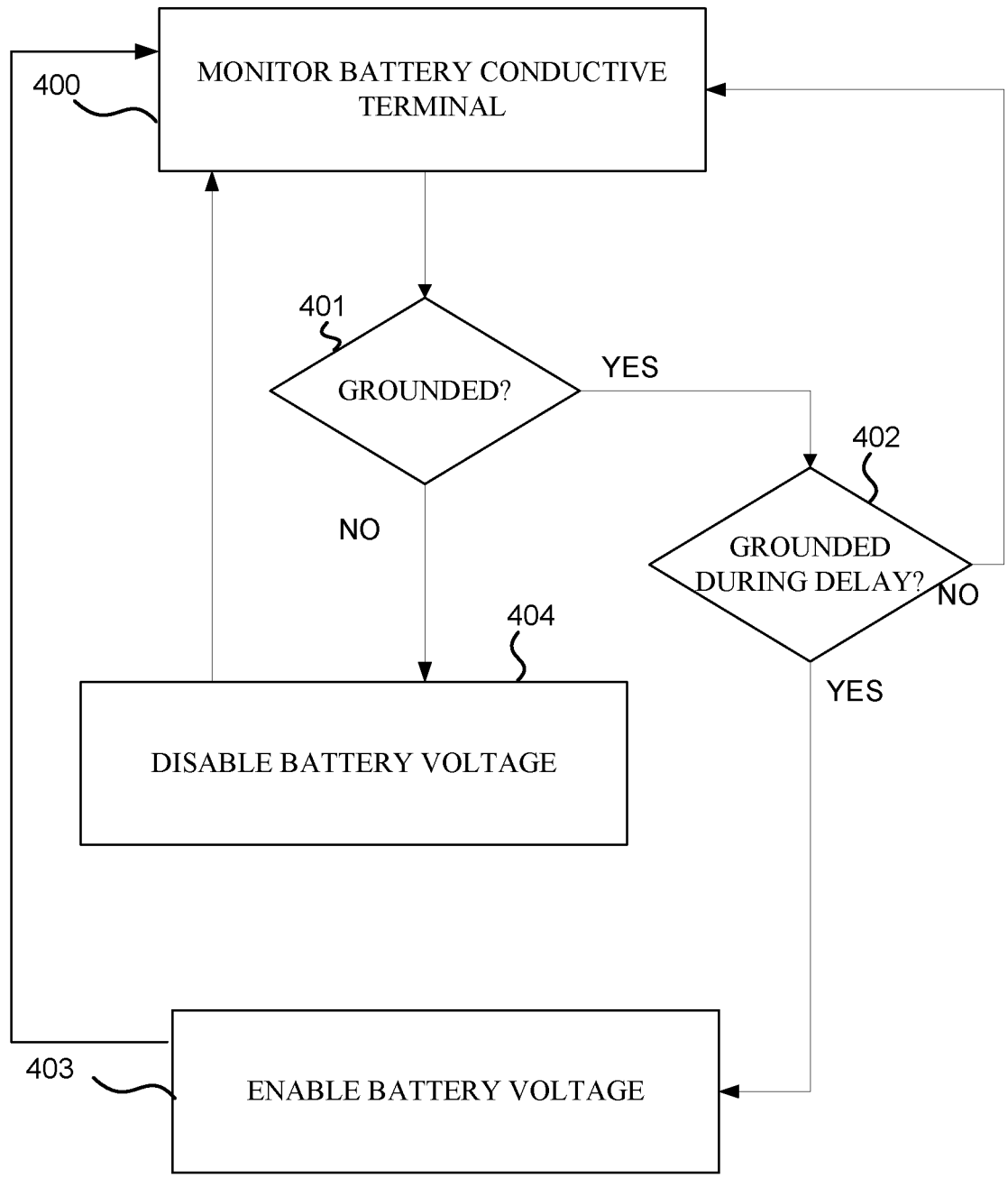
FIG. 6 illustrates a schematic flow chart of a method of battery output protection.

FIG. 6 illustrates, as a schematic flow chart, a method of battery output protection. Referring to FIG. 6, the process may comprise operations 400, 401, 402, 403, and 404. The process of FIG. 6 may be compiled into hardware logic or implemented in software instructions executed by a processor.

Operation 400 may include continuously monitoring the voltage, for example, on the conductive terminal 101 of a battery 100. This may be done, for example, by voltage measurement. The controller 104 can determine whether the conductive terminal 101 is grounded.

Operation 401 may include analyzing the monitored value to determine whether the conductive terminal 101 is grounded. The operation 401 is based on the monitoring of the voltage of the operation 401. If the conductive terminal 101 is grounded, the process will proceed to operation 402. If the conductive terminal 101 is not grounded, the process will proceed to operation 403.

Operation 402 includes triggering a timer delay. When the controller 104 detects that the conductive terminal 101 is grounded, the timer starts to run. If the conductive terminal 101 remains grounded during the timer period, the process will proceed to operation 403. If the conductive terminal 101 is not grounded during the timer period, the process will return to operation 400.

Operation 403 may include enabling the battery voltage. The battery connector terminals 102, 103 are enabled and are connected to the cell 107. The normal battery power (for example, the voltage) is switched on to the battery connector terminals 102, 103. The battery output is enabled, and the battery voltage is enabled at the battery connector terminals 102, 103. The process returns back to operation 400 for monitoring the conductive terminal 101.

Operation 404 may include disabling the battery voltage. The battery connector terminals 102, 103 are disabled. The terminals 102, 103 are disconnected from the cell 107, or at least one of them is disconnected. The battery power (for example, the voltage) is switched off. When disabled or switched off, the battery 100 does not have a voltage at the terminals 102, 103. In this state, the battery may be safe to use in storage and at manufacturing or repairing operations.

The methods and functionalities described herein may be performed by software in machine readable form on a tangible storage medium, e.g., in the form of a computer program comprising computer program code means adapted to perform all the functions and the steps of any of the methods described herein when the program is run on a computer and where the computer program may be embodied on a computer readable medium. The software can be suitable for execution on a parallel processor or a serial processor such that the method steps may be carried out in any suitable order, or simultaneously.

This acknowledges that software can be a valuable, separately tradable commodity. It is intended to encompass software, which runs on or controls "dumb" or standard hardware, to carry out the desired functions. It is also intended to encompass software which "describes" or defines the configuration of hardware, such as HDL (hardware description language) software, as is used for designing silicon chips, or for configuring universal programmable chips, to carry out desired functions. Alternatively, or in addition, the functionality described herein can be performed, at least in part, by one or more hardware logic components. For example, and without limitation, illustrative types of hardware logic components that can be used include Field-programmable Gate Arrays (FPGAs), Application-specific Integrated Circuits (ASICs), Application-specific Standard Products (ASSPs), System-on-a-chip systems (SOCs), Complex Programmable Logic Devices (CPLDs), etc.

Any range or device value given herein may be extended or altered without losing the effect sought. Also any embodiment may be combined with another embodiment unless explicitly disallowed.

Although the subject matter has been described in language specific to structural features and/or acts, it is to be understood that the subject matter defined in the appended claims is not necessarily limited to the specific features or acts described above. Rather, the specific features and acts described above are disclosed as examples of implementing the claims and other equivalent features and acts are intended to be within the scope of the claims.

The implementations illustrated and described herein as well as implementations not specifically described herein but within the scope of aspects of the disclosure constitute example means for monitoring a conductive terminal of a battery; wherein the conductive terminal may be permanently disconnected from battery terminals. For example, the elements illustrated in FIG. 1 to FIG. 6 constitute example means for detecting whether the conductive terminal is grounded, and example means for enabling the battery connector terminals if the conductive terminal is grounded, example means for detecting whether the conductive terminal is not grounded, and example means for disabling the battery connector terminals if the conductive terminal is not grounded According to an implementation, a battery comprises: a conductive terminal configured to electrically connect to a battery powered device; wherein the conductive terminal is disconnected from battery connector terminals; and a controller configured to detect whether the conductive terminal is grounded, and to enable the battery connector terminals if the conductive terminal is grounded and disable the battery connector terminals if the conductive terminal is not grounded.

Alternatively or in addition to the above, an output voltage of the battery connector terminals is enabled if the conductive terminal is grounded, and the output voltage of the battery connector terminals is disabled if the conductive terminal is not grounded. Alternatively or in addition to the above, the conductive terminal is electrically floating when the conductive terminal is not grounded. Alternatively or in addition to the above, the conductive terminal is grounded by connecting the battery to the battery powered device, wherein the conductive terminal is connected to a conductive terminal of the battery powered device, which is further connected to a ground of the battery powered device. Alternatively or in addition to the above, the conductive terminal is connected to a chassis of the battery connector terminals. Alternatively or in addition to the above, the conductive terminal is connected to a housing of the battery. Alternatively or in addition to the above, the conductive terminal comprises a pin, and wherein the battery connection terminals comprise pins. Alternatively, or in addition to the above, the conductive terminal is a part of a housing or a chassis of the battery connector terminals. Alternatively or in addition to the above, further including a cell of the battery, wherein the battery connector terminals are connected to the cell. Alternatively or in addition to the above, further including an integrated circuit configured for battery safety, wherein the integrated circuit comprises the controller. Alternatively or in addition to the above, further including a switch configured to connect and disconnect the battery connection terminals to and from a cell of the battery. Alternatively or in addition to the above, further including an integrated circuit comprising the switch. Alternatively or in addition to the above, further including a resistor connected between a cell positive terminal and the conductive terminal. Alternatively or in addition to the above, the resistor is used to set a high state for the controller to avoid false operations while the conductive terminal is electrically floating. Alternatively or in addition to the above, the controller is configured to a low state and a high state, and in the low state the battery is connected and the battery connector terminals are enabled, and in the high state the battery is not connected and the battery connector terminals are disabled. Alternatively or in addition to the above, the controller is further configured for a delay when enabling the battery connection terminals. Alternatively or in addition to the above, the battery connection terminals are enabled if the conductive terminal remains grounded during a time period of the delay. Alternatively or in addition to the above, the conductive terminal is connected to a main board ground of the battery powered device when the battery is connected to the battery powered device.

According to an implementation, a battery protection circuit comprises: a conductive terminal configured to electrically connect to a battery powered device; wherein the conductive terminal is disconnected from a cell of the battery; and a battery safety circuit configured to detect whether the conductive terminal is connected to a ground, and to enable the cell if the conductive terminal is connected to the ground and disable the cell if the conductive terminal is not connected to the ground.

According to an implementation, a method, performed by a processor, comprises: monitoring a conductive terminal of a battery; wherein the conductive terminal is disconnected from battery terminals; detecting whether the conductive terminal is grounded, and enabling the battery connector terminals if the conductive terminal is grounded; and detecting whether the conductive terminal is not grounded, and disabling the battery connector terminals if the conductive terminal is not grounded.

It will be understood that the benefits and advantages described above may relate to one embodiment or may relate to several implementations. The implementations are not limited to those that solve any or all of the stated problems or those that have any or all of the stated benefits and advantages. It will further be understood that reference to 'an' item refers to one or more of those items.

The steps of the methods described herein may be carried out in any suitable order, or simultaneously where appropriate. Additionally, individual blocks may be deleted from any of the methods without departing from the spirit and scope of the subject matter described herein. Aspects of any of the implementations described above may be combined with aspects of any of the other implementations described to form further implementations without losing the effect sought.

The term 'comprising' is used herein to mean including the method, blocks or elements identified, but that such blocks or elements do not comprise an exclusive list and a method or apparatus may contain additional blocks or elements.

It will be understood that the above description is given by way of example only and that various modifications may be made by those skilled in the art. The above specification, examples and data provide a complete description of the structure and use of exemplary implementations. Although various implementations have been described above with a certain degree of particularity, or with reference to one or more individual implementations, those skilled in the art could make numerous alterations to the disclosed implementations without departing from the spirit or scope of this specification.

The invention claimed is:

1. A battery, comprising:
a battery cell having a first terminal and a second terminal;
an output port configured to electrically connect the battery to a battery-powered device, the output port comprising:
a first output terminal coupled to the first terminal of the battery cell;
a second output terminal selectively coupled to the second terminal of the battery cell; and
a conductive terminal distinct from the first and second output terminals; and a controller configured to:
detect whether the conductive terminal is grounded,
couple the second output terminal to the second terminal of the battery cell when the conductive terminal is grounded, and
decouple the second output terminal from the second terminal of the battery cell when the conductive terminal is not grounded.

2. The battery of claim 1, wherein the conductive terminal is detected to be grounded based on a voltage level of the conductive terminal.

3. The battery of claim 1, wherein the conductive terminal is determined not to be grounded when a voltage of the battery cell is detected at the conductive terminal.

4. The battery of claim 1, further including an integrated circuit configured for battery safety, wherein the integrated circuit comprises the controller.

5. The battery of claim 1, further including a switch configured to connect and disconnect the at least one of the first terminal or the second terminal to and from a the battery cell.

6. The battery of claim 5, further including an integrated circuit comprising the switch.

7. The battery of claim 1, further including a resistor connected between a cell positive terminal and the conductive terminal.

8. The battery of claim 7, wherein the resistor is used to set a high state for the controller to avoid false operations while the conductive terminal is electrically floating.

9. The battery of claim 1, wherein the controller is configured to a low state and a high state, and in the low state the battery cell is connected to the conductive terminal and the first terminal and the second terminal are enabled, and in the high state the battery is not connected to the conductive terminal and the first terminal and the second terminal are disabled.

10. The battery of claim 1, wherein the controller is further configured for a delay when enabling the first terminal and the second terminal.

11. The battery of claim 10, wherein the battery first terminal and the second terminal are enabled if the conductive terminal remains grounded during a time period of the delay.

12. A battery protection circuit configured to the protect a battery cell having a first terminal and a second terminal being selectively coupled to, the battery protection circuit comprising:
   an output port configured to electrically connect the battery to a battery-powered device, the output port comprising:
      a first output terminal coupled to the first terminal of the battery cell;
      a second output terminal selectively coupled to the second terminal of the battery cell; and
      a conductive terminal distinct from the first and second output terminals; and
   a controller configured to:
   detect whether the conductive terminal is grounded, couple the second output terminal to the second terminal of the battery when the conductive terminal is grounded, and decouple the second output terminal of the battery cell when if the conductive terminal is not grounded.

13. The battery protection circuit of claim 12, wherein an output voltage of the battery output terminals is enabled if the conductive terminal is grounded, and the output voltage of the battery output terminals is disabled if the conductive terminal is not grounded.

14. The battery protection circuit of claim 12, further including a cell of the battery, wherein the battery output terminals are connected to the cell.

15. The battery protection circuit of claim 12, further including an integrated circuit configured for battery safety, wherein the integrated circuit comprises the controller.

16. The battery protection circuit of claim 12, further including a switch configured to connect and disconnect the battery connection terminals to and from a cell of the battery.

17. A method, performed by a battery controller of a battery, comprising
   monitoring a conductive terminal of the battery, wherein the conductive terminal is distinct from battery output terminals of the battery, and wherein the battery output terminals of the battery are selectively coupled to terminals of a battery cell of the battery;
   detecting that the conductive terminal is grounded and, in response, coupling the battery output terminals to the terminals of the battery cell; and
   detecting that the conductive terminal has a same voltage as the battery cell and, in response, decoupling the battery output terminals from the terminals of the battery cell.

18. The method of claim 17, further comprising actuating a switch configured to connect and disconnect the battery connection terminals to and from a cell of the battery.

19. The method of claim 17, wherein said detecting whether the conductive terminal is not grounded comprises detecting a voltage of the battery at the conductive terminal.

20. The method of claim 17, further comprising driving a controller monitoring the conductive terminal to a low state in which the battery is connected and the battery connector terminals are enabled and a high state in which the battery is not connected and the battery connector terminals are disabled.

* * * * *